(12) United States Patent
Pohl et al.

(10) Patent No.: US 6,551,874 B2
(45) Date of Patent: Apr. 22, 2003

(54) SELF-ALIGNED STI PROCESS USING NITRIDE HARD MASK

(75) Inventors: John Pohl, Leicester (GB); Nirmal Chaudhary, Poughkeepsie, NY (US); Veit Klee, Pleasant Valley, NY (US); Tobias Mono, Poughkeepsie, NY (US); Paul Schroeder, Dresden-Langerbrueck (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 09/888,287

(22) Filed: Jun. 22, 2001

(65) Prior Publication Data

US 2003/0045051 A1 Mar. 6, 2003

(51) Int. Cl.[7] .......................................... H01L 21/8242
(52) U.S. Cl. ........................ 438/243; 438/353; 438/405
(58) Field of Search ................................. 438/243, 353, 438/405, 605, 591, 704, 745, 753

(56) References Cited

U.S. PATENT DOCUMENTS

| 5,994,197 A | * | 11/1999 | Liao ............................ 438/396 |
| 6,251,734 B1 | * | 6/2001 | Grivna et al. ............... 438/296 |
| 6,255,160 B1 | * | 7/2001 | Huang ......................... 438/253 |
| 2001/0044190 A1 | * | 11/2001 | Heo et al. ................... 438/270 |

* cited by examiner

*Primary Examiner*—Amir Zarabian
*Assistant Examiner*—Pamela Perkins
(74) *Attorney, Agent, or Firm*—Slater & Matsil, L.L.P.

(57) ABSTRACT

A nitride hard mask (230) is used to isolate active areas of a DRAM cell. The shallow trench isolation (STI) method includes forming memory cells comprising deep trenches (216) on a semiconductor wafer (200). The memory cell deep trenches (216) are separated from active areas (212) by a region of substrate (212). A nitride hard mask (230) is formed over the semiconductor wafer (200). The wafer (200) is patterned with the nitride hard mask (230), and the wafer (200) is etched to remove the region of substrate (212) between the deep trenches and active areas to provide shallow trench isolation. An etch chemistry selective to the nitride hard mask (230) is used.

21 Claims, 6 Drawing Sheets

SELF-ALIGNED STI PROCESS USING NITRIDE HARD MASK

TECHNICAL FIELD

The present invention relates generally to the fabrication of semiconductor integrated circuit (IC) structures, and more particularly to the formation of shallow trench isolation (STI) structures in IC devices.

BACKGROUND OF THE INVENTION

Semiconductor devices are used in a variety of electronic applications, such as personal computers and cellular phones, for example. One such semiconductor product widely used in electronic systems for storing data is a semiconductor memory, and one common type of semiconductor is a dynamic random access memory (DRAM).

A DRAM typically includes millions or billions of individual DRAM cells, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

Another memory semiconductor device is called a ferroelectric random access memory (FRAM). An FRAM typically has a similar structure to a DRAM but is comprised of materials such that the storage capacitor does not need to be refreshed continuously as in a DRAM. Common applications for FRAM's include cellular phones and digital cameras, for example.

Memory devices are typically arranged in an array of memory cells. A source/drain region of the cell access FET is coupled to a bitline, and the other source/drain region is coupled to a plate of a respective storage capacitor. The other plate of the capacitor is coupled to a common plate reference voltage. The gate of the transistor is coupled to a wordline. The storing and accessing of information into and from memory cells is achieved by selecting and applying voltages to the wordlines and bitlines.

In fabricating semiconductor devices such as DRAM's, shallow trench isolation (STI) is a technique used to provide electrical isolation between various devices. FIGS. 1–3 illustrate a prior art STI technique used to isolate active areas of a DRAM array. A crystalline silicon 12 substrate covered with a layer of pad nitride 14 (e.g., 200 nm of silicon nitride) is patterned with trenches 13, e.g. deep trenches, may have areas of crystalline silicon substrate in regions therebetween. For example, two deep trenches 13 are shown in FIG. 1, which may comprise two storage cells or capacitors of a DRAM. A collar 15 is formed within each trench 13 and comprises a thin oxide liner, for example. The trenches 13 are filled with doped polycrystalline silicon (polysilicon) 16, which is etched back to a depth of, e.g., between 300 to 600 Angstroms below the silicon 12 surface.

Exposed portions of the nitride layer 14 and the polysilicon 16 are covered with a nitride frame 18. The nitride frame 18 may comprise, for example, 20 nm of silicon nitride. A hard mask 20 comprising boron-doped silicon glass (BSG), or alternatively, tetraethoxysilance (TEOS), is deposited over the nitride frame 18. BSG is typically used for the hard mask 20 because it is easily reflowable. Generally, for example, about 280 nm of BSG is deposited.

An anti-reflective coating (ARC) 22 comprising, for example, an organic polymer, is deposited over the BSG hard mask 20, and a resist 24 typically comprising an organic polymer is deposited over the ARC 22. ARC 22 is typically used to reduce reflection during exposure, which can deteriorate the quality of the image being patterned.

The resist 24 is exposed, patterned and etched to remove exposed portions, in a positive exposure process, although a negative exposure process may be used to pattern the resist 24.

After an ARC 22 open step, the semiconductor wafer is exposed to an etch process, e.g. an anisotropic etch e.g. in a plasma reactor, to transfer the resist 24 pattern to the BSG hard mask 20, the nitride frame 18 and nitride layer 14, as shown in FIG. 2. Reactive ion etching (RIE) is often used to transfer the pattern to the BSG hard mask 20, the nitride frame 18 and nitride layer 14. The etch may stop on the polysilicon 16 and silicon 12, or alternatively, the etch may include a slight over-etch of silicon 12 to ensure that no portions of the nitride layer 14 remain over the top surface of the silicon 12. The active areas (AA) are defined as the wafer 10 areas that are protected by the hard mask 20 and therefore are not etched. The resist 24 and the ARC 22 are removed, e.g., in a dry strip using oxygen plasma.

Portions of the wafer 10 not covered by the BSG hard mask 20 are etched to form shallow trenches within the wafer 10 using the BSG hard mask 20 to pattern the trenches, opening the STI area 40, as shown in FIG. 3. The polysilicon 16, collars 15, and silicon 12 are etched off to a fixed depth, for example, 300 to 350 nanometers, which forms the shallow trench isolation at 40. The BSG hard mask 20 is then removed prior to any further processing steps. Typically, the trench 40 formed in the silicon 12 and polysilicon 16 will be filled with an insulator such as an oxide, and the wafer 10 is then chemically-mechanically polished (CMP'd) to the nitride layer 14 surface, leaving oxide in the trenches 40 to provide isolation between devices (not shown). The top portion 42 of polysilicon 16 functions as the strap by providing an electrical connection between the deep trench capacitor and the transistor of the memory cell (not shown).

Another prior art STI process is shown in prior art FIGS. 4–6. This prior art process is similar to the one shown in FIGS. 1–3, with no nitride frame 18 being present. A crystalline silicon 112 substrate covered with a layer of pad nitride 114 is patterned with trenches, e.g. deep trenches, which may have areas of crystalline silicon centered therebetween. A collar 115 is formed within the trenches, comprising a thin oxide liner, for example.

The trenches are filled with polysilicon 116, which is etched back below the surface of the pad nitride 114 and crystalline silicon 112. A hard mask 120 comprising BSG or TEOS is deposited over the polysilicon 116 and silicon nitride 114. An ARC 122 is deposited over the BSG hard mask 120, and a resist 124 is deposited over the ARC 122. The resist 124 is exposed, patterned and etched.

After an ARC 122 open step, the semiconductor wafer 100 is exposed to an etch process to transfer the resist 24 pattern to the BSG hard mask 20, as shown in FIG. 5. The etch stops on the crystalline silicon 112 in the center region, as shown. The resist 124 and the ARC 122 are removed, and exposed portions of the wafer 100 are etched to form shallow trenches within the wafer 100 using the BSG hard mask 120 to pattern the trenches, as shown in FIG. 3. The BSG hard mask 120 is then removed prior to any further processing steps.

A problem with using BSG as a hard mask 20/120 as in the prior art structures 10/100 described herein is misalignment problems between the active areas (AA) and the deep trench region, which can result in defective devices being manufactured. For example, the mask may have been misaligned, which misalignment may be transferred to the wafer 10/100, resulting in an excess amount of polysilicon 16/116 being removed (see FIG. 3, at 42) which affects the trench buried strap resistance, and/or an inadequate amount of isolation between active areas. With conventional STI hard mask sequences, the final strap profile is dependent on the initial lithography overlay integrity.

FIG. 7 illustrates a top view of the wafer 100 shown in FIGS. 4–6 including active areas 112, STI region 140 and deep trenches 116. The structure shown in FIG. 7 shows a properly aligned DRAM having silicon active areas 112 that are adjacent and electrically coupled to strap regions 142 of the deep trench 116 polysilicon. Regions 142 of the DT 116 form the strap coupling the deep trench capacitor (lower part of 116, not shown) to an access transistor (not shown) in the active area 112.

FIG. 8 illustrates a top view of a prior art DRAM 100 having misalignment problems. The pattern for the shallow trench isolation 140 was misaligned, resulting in a narrow strap 142a on the left side and a wider strap 142b on the right side. If the pillar of polysilicon 116 comprising the strap 142a is too narrow, as shown, then the resistance of the strap 142a is increased, which deleteriously affects the DRAM memory device. For example, a higher strap resistance reduces the drive current to the access transistor (not shown) during operation of the device 100.

FIG. 9 illustrates a top view of a wafer 100 having critical misalignment problems, with no buried strap coupling the deep trench 116 and active area 112. If there is no overlap (e.g. at 143) of polysilicon 116 and silicon 112, then no electrical connection is made between the capacitor and access transistor, resulting in a defective DRAM device 100.

Generally, it is undesirable for portions of the polysilicon 116 in the deep trench to be removed during STI, because of the risk of misalignment and the risk of forming too narrow of a strap 142, or no strap 142 at all. These misalignment problems shown in FIGS. 8 and 9 may require rework of the wafer 10/100, if the overlay is beyond the specification target of, e.g., around 60 nm. Reworking the wafer 10/100 requires stripping the resist 24/124 and repeating the lithography step, which is time-consuming and increases the overall cost per wafer 10/100. As DRAM-based technologies utilizing deep trench integration schemes continue to be scaled down in size, eliminating the effect of lithography misalignment on trench buried strap resistance becomes increasingly important.

Furthermore, in the prior art FIGS. 1–6 shown, the BSG hard mask 20/120 must be removed or stripped off because BSG is incompatible with the semiconductor wafer processing, for example, fragments of BSG can be deposited within the trenches if it is not removed. The removal of the BSG hard mask 20/120 requires an additional wet etch step, which is disadvantageous.

What is needed in the art is a hard mask scheme that is not prone to misalignment problems, thereby reducing the lithography rework rate in a semiconductor production environment.

What is also needed in the art is a hard mask scheme that does not require immediate removal of the hard mask after STI.

SUMMARY OF THE INVENTION

The present invention achieves technical advantages as a nitride hard mask for STI.

Disclosed is a method of forming a memory device, comprising forming memory cells on a semiconductor wafer, each memory cell including a deep trench proximate an active area, the deep trenches separated from the active areas by a semiconductor region; forming a nitride hard mask over the semiconductor wafer; and patterning the wafer with the nitride hard mask and etching to remove the semiconductor region between the deep trenches and active areas.

Also disclosed is a STI method for a semiconductor wafer, comprising providing a wafer including a first semiconductor material; forming at least two deep trenches within the first semiconductor material while leaving a portion of first semiconductor material in a region between the two deep trenches; depositing an insulating collar within the deep trenches; depositing a second semiconductor material over the insulating collar to fill the deep trenches to a height below the first semiconductor material; forming a nitride hard mask over at least the second semiconductor material; and using the nitride hard mask to etch away the first semiconductor material in the region between the two deep trenches.

Advantages of embodiments of the invention include improving overlay and preventing the underlying polysilicon deep trench material from being etched. Using a nitride hard mask provides a self-aligned active area, eliminating the effect of lithography misalignment on trench buried strap resistance by removal of the polysilicon in the deep trenches, which is problematic in the prior art. The final strap profile is independent of the lithography overlay due to the highly selective silicon-to-nitride etch. The nitride hard mask may remain present during subsequent processing steps, rather than needing to be removed immediately after patterning the STI, as in the prior art. A BSG hard mask must be removed with a separate wet etch: thus, a wet etch step is eliminated in accordance with the present invention. Another advantage is that the need for a nitride frame is eliminated, by the use of the nitride hard mask.

The method and structure described herein may be used and applied to a variety of semiconductor devices requiring STI processes, including memory integrated circuits, such as DRAM's and FRAM's.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of preferred embodiments of the present invention will be discussed, followed by a discussion of some advantages of the invention. Only two trenches are shown in each figure, although many trenches and other components of a memory cell are present in the semiconductor devices shown.

Figure 10:
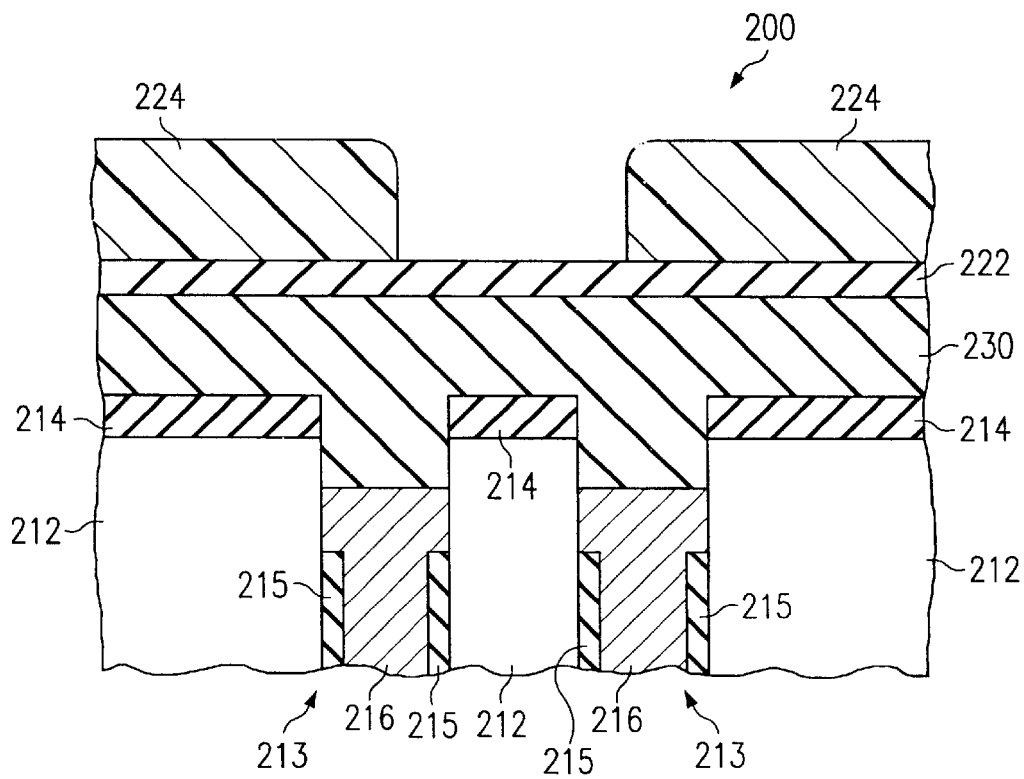
FIGS. 10–12 show cross-sectional views of a preferred embodiment of the present invention at various stages of fabrication having a nitride hard mask.
Figure 11:
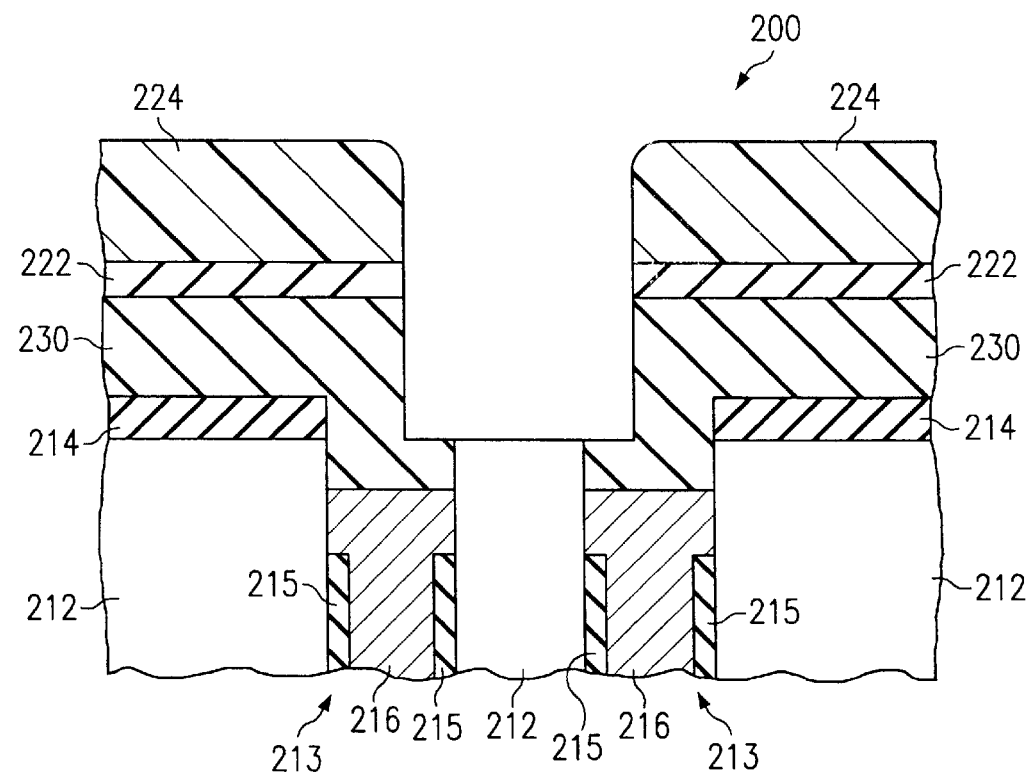
Figure 12:
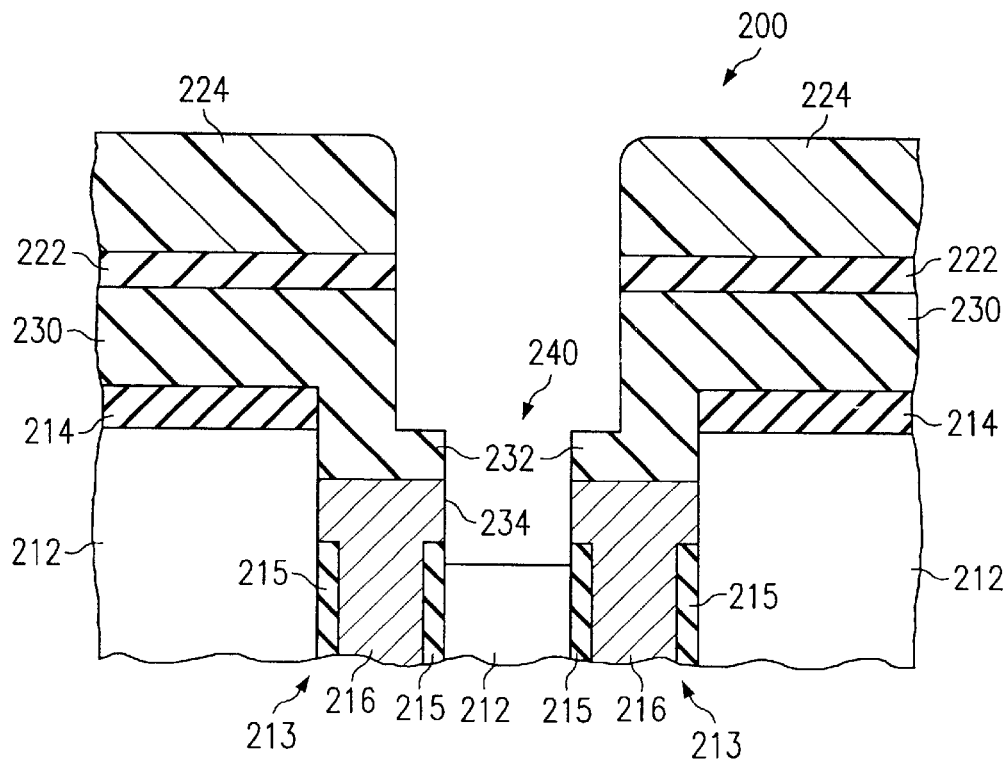

FIGS. 10–12 show cross-sectional views of a preferred embodiment of the present STI method and structure in various stages of fabrication. While the STI process described herein may be used in a variety of semiconductor devices, the invention is described and shown in use as a method of isolating active areas of a DRAM array.

FIG. 10 shows a cross-sectional view of a semiconductor memory device 200 having a first semiconductor material 212 preferably comprising a substrate. The substrate typically comprises single-crystalline silicon and may include other semiconductor elements, e.g. transistors, diodes, etc. The substrate may also include epitaxially grown silicon over other layers.

The first semiconductor material 212 is covered with a layer of pad nitride 214, e.g., 120–200 nm of SiN. The pad nitride 214 and first semiconductor material 212 are patterned with trenches 213, e.g. deep trenches (DTs), which have regions of first semiconductor material 212 centered therebetween. A collar 215 is deposited within the trenches 213, comprising a thin oxide liner, for example. The trenches 213 are filled with second semiconductor material 216 which preferably comprises polysilicon. The second semiconductor material 216 is etched back to a desired level below the top surface of the first semiconductor material 212. The deep trenches 213, collar 215 and polysilicon 216 may form elements of a storage capacitor of a DRAM, for example.

In accordance with the present invention, a hard mask 230 comprising a nitride is deposited over the pad nitride 214 and the second semiconductor material 216. The nitride hard mask 230 may be, for example, 50–100 nm thick and is preferably deposited using low pressure chemical vapor deposition (LPCVD).

An ARC 222 comprising, for example, an organic polymer, is deposited over the nitride hard mask 230, and a resist 224 comprising an organic polymer, for example, is deposited over the ARC 222. The resist 224 is selectively exposed to form a pattern and developed to remove exposed portions, in a positive exposure process, for example, although a negative exposure process may be used to pattern the resist 224.

The semiconductor wafer 200 is exposed to an etch process to transfer the resist 224 pattern to the nitride hard mask 230, as shown in FIG. 11. The etch is designed to stop at or just below the surface of the first semiconductor material 212.

The resist 224 and the ARC 222 are removed. Exposed portions of the wafer 200 are etched to form shallow trenches within the wafer 200 using the nitride hard mask 230 to form the trenches, opening the STI area 240, as shown in FIG. 12.

More particularly, the wafer 200 is preferably etched as follows. The nitride mask-open time (FIG. 11) preferably comprises a fixed time etch, e.g., that is anisotropic in nature using a combination of $CHF_3$ and $CF_4$ for about 30–55 seconds, such that no more than about 100 Angstroms of nitride is recessed below the first semiconductor material 212 within the deep trench. The etch time is calculated such that the top level of the nitride 230 material in the trench region is either at or just below the top surface of the silicon 212 (or the bottom surface of pad nitride 214), as shown in FIG. 11.

The region of the first semiconductor materials 212 between the two trenches of second semiconductor materials 215 is etched, leaving STI region 240. This main silicon 212 etch (FIG. 12), e.g., using a combination of NF3 and HBr, is preferably highly anisotropic and highly selective to nitride in accordance with an embodiment of the present invention, such that no more than 100–150 Angstroms of nitride 230 is consumed, leaving between 300 to 500 Angstroms of the hard nitride mask 230 over polysilicon 216, at 232.

Because the polysilicon 216 in the deep trench is still covered by the nitride hard mask at 232 during the STI etch, no removal of polysilicon 216 occurs in the deep trench region at 234. Embodiments that include this feature are advantageous because since no polysilicon 216 is removed, the trench resistance is not deleteriously affected, as in prior art STI techniques.

The nitride hard mask 230 may be left in place during one or more processing steps, and then removed. A subsequent STI dielectric fill and CMP formation follows, using conventional techniques.

Figure 13:
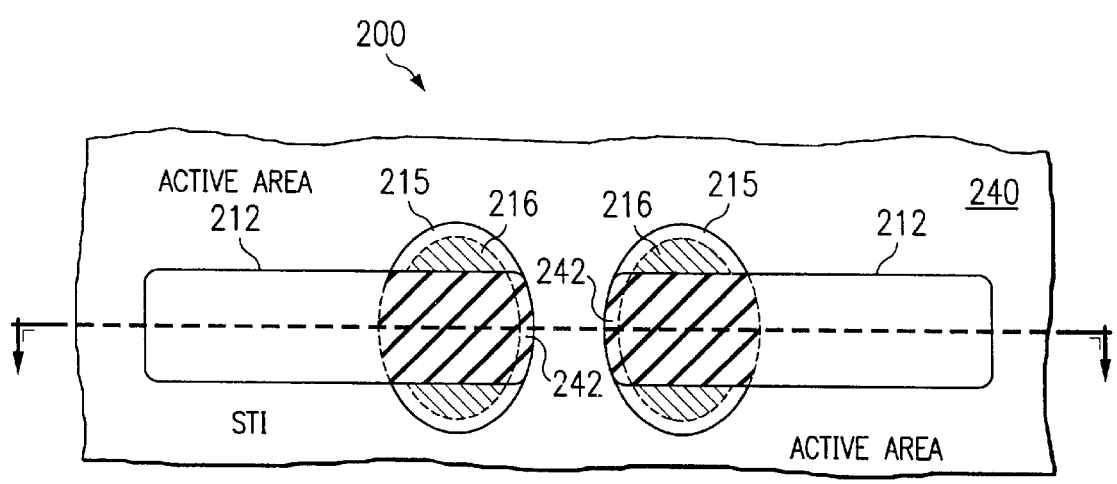
FIG. 13 is a top view of a DRAM manufactured with the present method.

FIG. 13 shows a top view of the wafer 200 having active areas 212 of the first semiconductor material which are adjacent regions 242 of the deep trenches 216 comprising the second semiconductor material. The second semiconductor material at 242 forms the strap which electrically couples the active regions 212 to a plate of the storage capacitor in the deep trench 216, for example. Note that no portion of the deep trench polysilicon 216 is removed during the STI etch in accordance with an embodiment of the present invention. For example, polysilicon 242 is the same dimension in width as the dimension of the remainder of the pillar of polysilicon 216 in the deep trench. The STI region 240 does not include any portion of the deep trench region 216, as shown.

Using a nitride for a hard mask 230 in accordance with the present invention rather than using a BSG hard mask 20/120 as in the prior art can be advantageous for several reasons. First, etch chemistries that are more selective to the nitride hard mask 230 material may be used, resulting in improved overlay and preventing the underlying polysilicon 216 from being etched. Using a nitride hard mask provides a self-aligned active area, eliminating the effect of lithography misalignment on trench buried strap resistance by removal of the polysilicon 16/116, as in the prior art. With a nitride hard mask 230, the final strap profile is independent of the lithography overlay due to the highly selective silicon-to-nitride etch. For example, because a thin layer of the nitride hard mask 230 remains over the polysilicon 234 at 232, the polysilicon 216 is not etched, preventing any effect on the trench buried strap resistance. In accordance with the preferred embodiment of the present invention, no polysilicon 216 is removed in the deep trench region, and the strap 242 is protected.

Furthermore, the preferred embodiment of the present nitride hard mask 230 invention simplifies the STI mask-open procedure, by eliminating the use of a BSG or TEOS hard mask 20/120, because there are no material property differences between the pad nitride 214 and the nitride hard mask 230 used for the STI mask-open.

Also, because nitride is not a contaminant like BSG is, the nitride mask 230 may remain present during subsequent processing steps, rather than being removed immediately after patterning the STI.

Furthermore, a BSG hard mask 20/120 must be removed with a separate wet etch. Therefore, a wet etch step can be eliminated by the use of the present invention. The invention simplifies shallow isolation trench integration formation, by using nitride as a hard mask 230 with no additional oxide hard mask deposition and strip.

Figure 1:
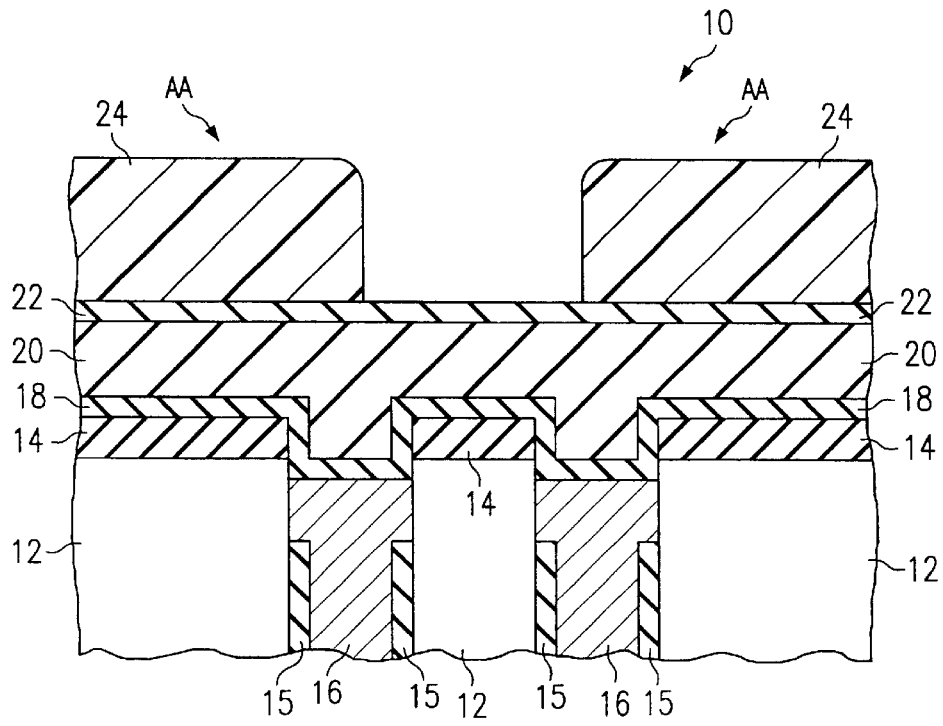
FIGS. 1–3 illustrate cross-sectional views of a prior art DRAM deep trench capacitor having a BSG hard mask.
Figure 2:
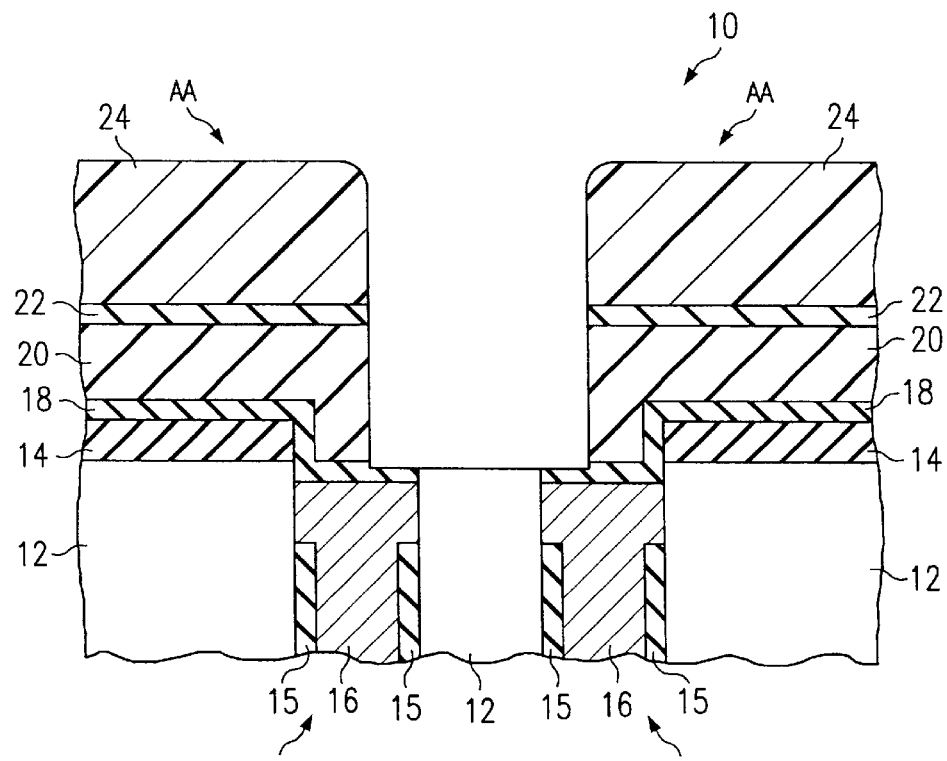
Figure 3:
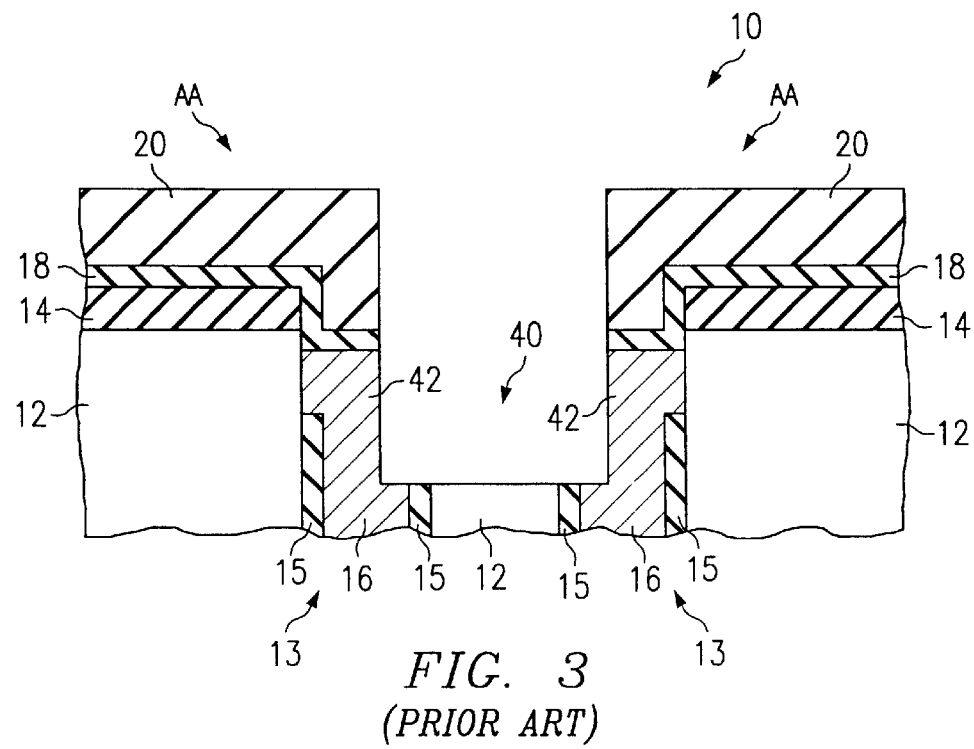
Figure 4:
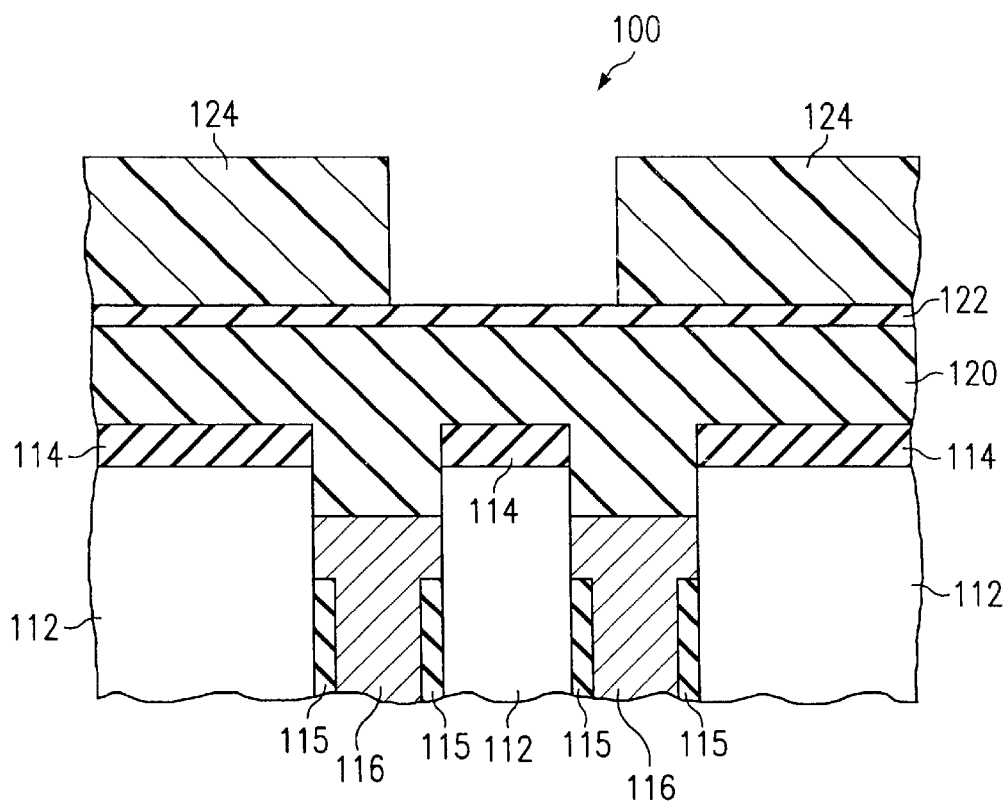
FIGS. 4–6 illustrate cross-sectional diagrams of a prior art DRAM deep trench capacitor having a BSG hard mask.
Figure 5:
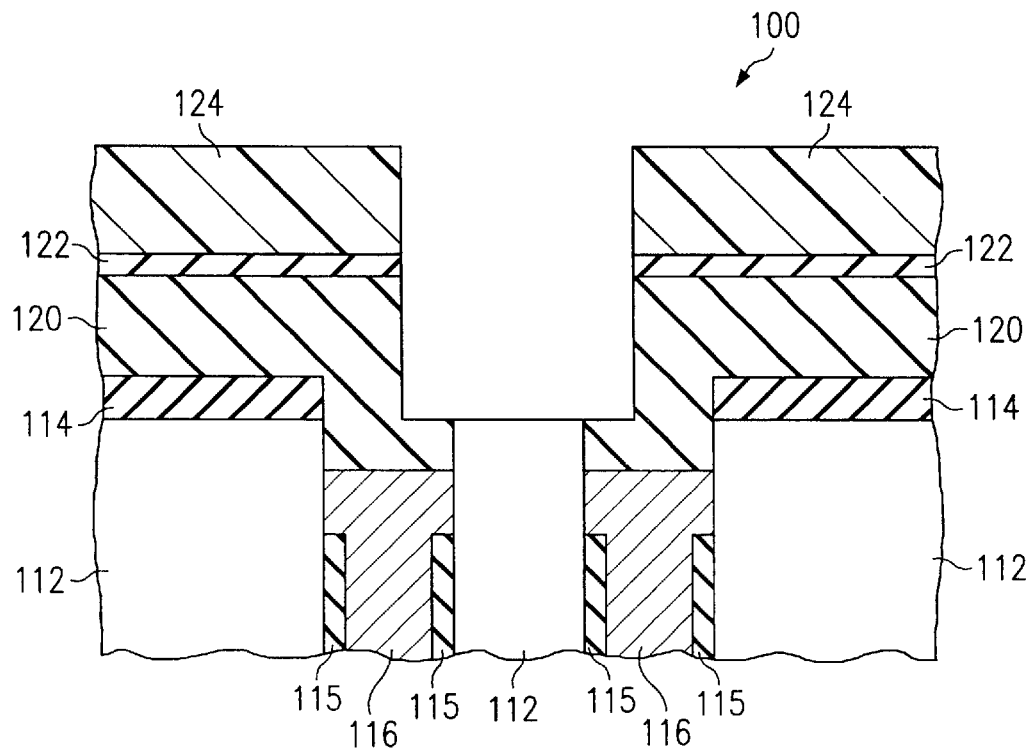
Figure 6:
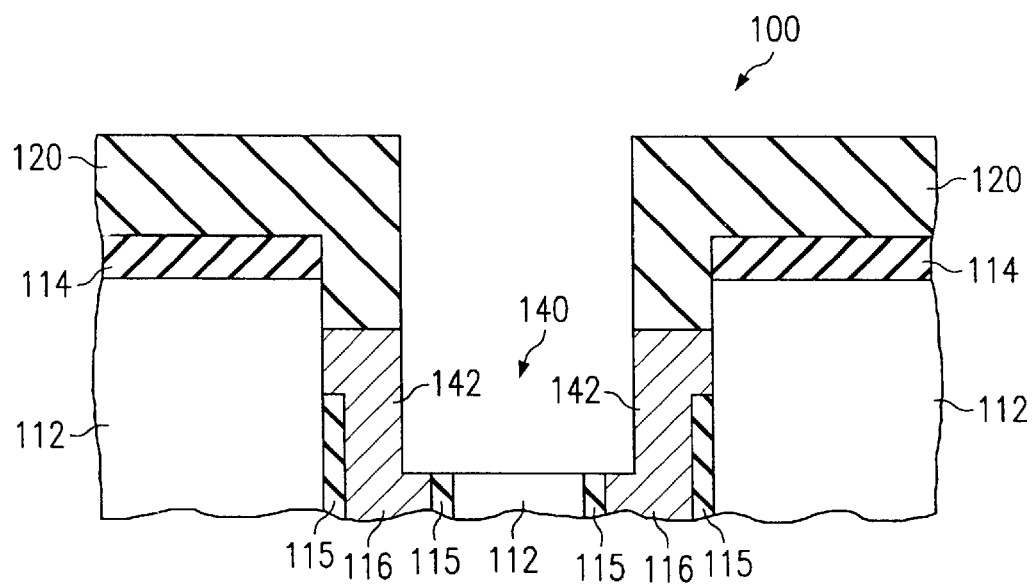
Figure 7:
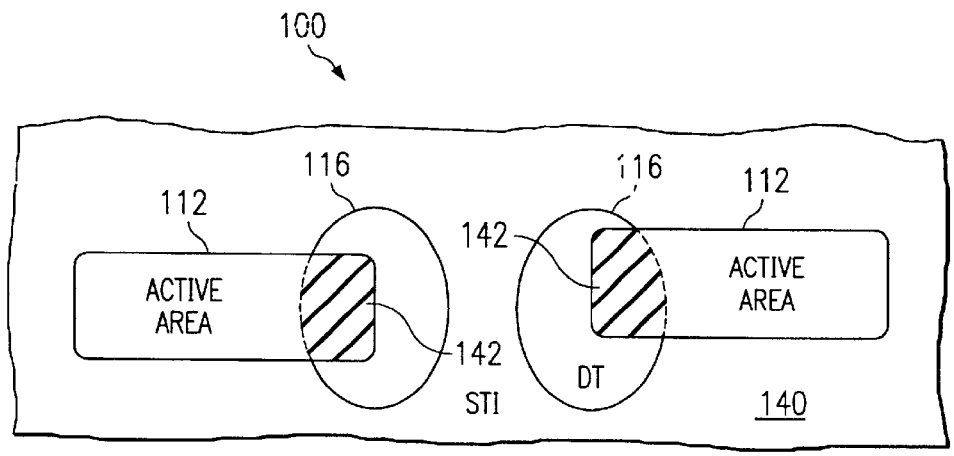
FIGS. 7 shows a top view of prior art DRAMs.
Figure 8:
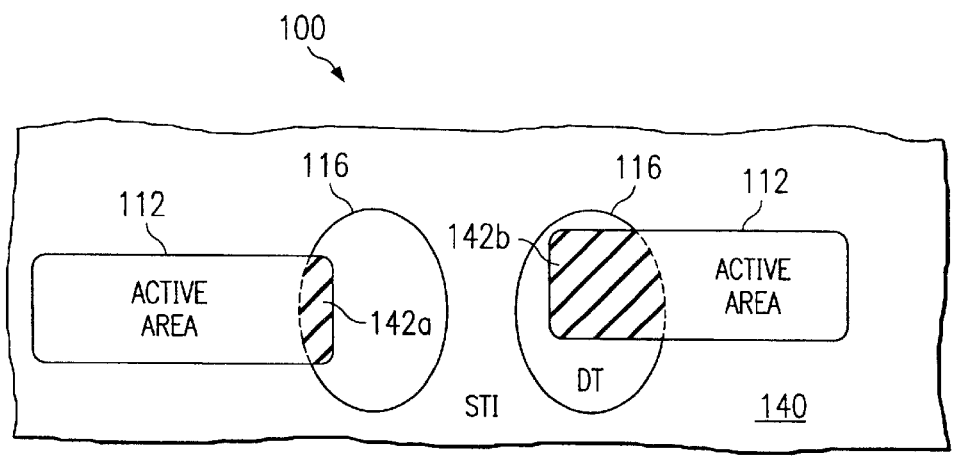
FIGS. 8 and 9 show top views of prior art DRAMs having STI alignment problems of deep trench capacitors, access transistors and the strap.
Figure 9:
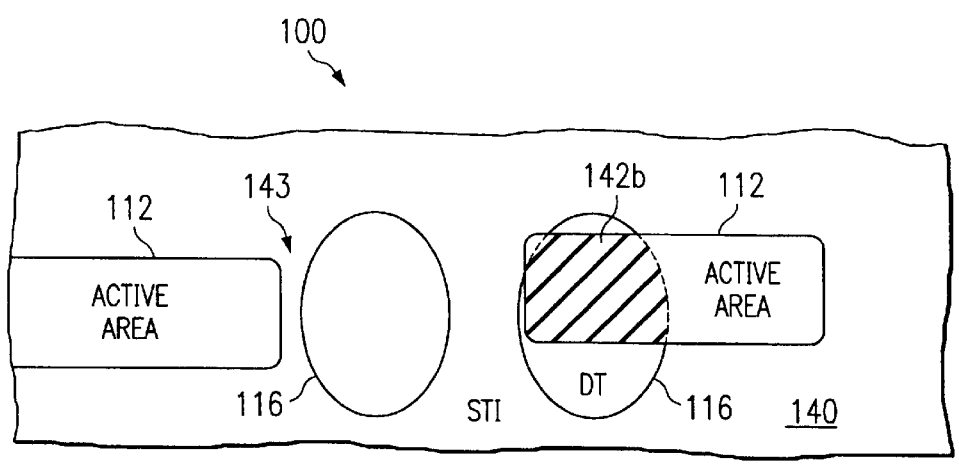

Another advantage of the preferred embodiment of the present invention is that the need for a nitride frame 18 is eliminated, by the use of the nitride hard mask 230. In the prior art, a nitride frame 18 was used to improve alignment, by limiting the destructive interference of light reflecting off the top of polysilicon 16, of the prior art drawing of FIG. 3. The prior art nitride frame deposition thickness has a very narrow process window e.g. 60 nm, which is difficult to achieve.

The present invention is described herein with reference to silicon material. Alternatively, compound semiconductor materials such as GaAs, InP, Si/Ge, or SiC may be used in place of silicon, as examples. The invention has also been described with reference to a DRAM; however, the nitride hard mask for STI is also beneficial in other semiconductor manufacturing applications that require STI processes.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of forming a memory device, the method comprising:
    forming memory cells on a semiconductor wafer, each memory cell including a deep trench proximate an active area, wherein at least two adjacent deep trenches define a semiconductor region therebetween;
    forming a nitride hard mask over the semiconductor region and the at least two deep trenches; and
    patterning the nitride hard mask and etching to remove the semiconductor region, wherein the nitride hard mask prevents the deep trenches from being etched during the etching step.

2. The method according to claim 1, wherein the memory cells comprise deep trenches filled with doped polysilicon, wherein the deep trench polysilicon remains substantially intact during the wafer patterning and etching.

3. The method according to claim 1 wherein forming a nitride hard mask comprises:
    depositing a nitride layer over a surface of the wafer;
    depositing a resist over the nitride layer;
    patterning the resist;
    forming openings in the nitride layer with a fixed time etch, wherein a portion of the nitride layer is removed, wherein the deep trenches remain covered by a portion of the nitride layer;
    removing the resist; and
    etching the semiconductor region between the deep trench and active area with an etch selective to nitride.

4. The method according to claim 3 wherein the nitride layer is deposited using low pressure chemical vapor deposition (LPCVD).

5. The method according to claim 3 wherein the nitride layer comprises a silicon nitride layer.

6. The method according to claim 3, further comprising depositing an anti-reflective coating (ARC), prior to depositing the resist, and further comprising removing the ARC after removing the resist.

7. The method according to claim 3 wherein forming openings in the nitride layer comprises removing 100 Angstroms or less of the nitride layer within the deep trench.

8. The method according to claim 7 wherein etching the semiconductor wafer comprises removing 100 to 150 Angstroms of the nitride layer from over the deep trenches.

9. The method according to claim 1 wherein the memory device is a DRAM, wherein the DRAM strap profile is independent of the nitride layer overlay.

10. A shallow trench isolation (STI) method for a semiconductor wafer, comprising:
    providing a wafer including a first semiconductor material, the first semiconductor material having a top surface;
    forming at least two deep trenches within the first semiconductor material while leaving a portion of first semiconductor material in a region between the two deep trenches;
    depositing an insulating collar within the deep trenches;
    depositing a second semiconductor material over the insulating collar to fill the deep trenches to a height below the first semiconductor material top surface;
    forming a nitride hard mask over at least the second semiconductor material; and
    using the nitride hard mask to prevent etching of the second semiconductor material while etching away the first semiconductor material in the region between the two deep trenches.

11. The method according to claim 10, further comprising depositing a pad nitride over the first semiconductor material.

12. The method according to claim 11, further comprising performing a chemical-mechanical polish to remove the second semiconductor material from at least the pad nitride top surface, after depositing the second semiconductor material.

13. The method according to claim 10 wherein forming a nitride hard mask comprises:
    depositing a nitride hard mask over the wafer surface;
    depositing a resist over the nitride hard mask;
    patterning the resist;
    opening the nitride hard mask with a fixed time etch, wherein a portion of the nitride hard mask is removed, wherein the deep trenches remain covered by a thin portion of the nitride hard mask;
    removing the resist; and
    etching the first semiconductor material between the two deep trenches with an etch selective to nitride.

14. The method according to claim 13 wherein the nitride hard mask is deposited using low pressure chemical vapor deposition (LPCVD).

15. The method according to claim 13 wherein the nitride hard mask comprises silicon nitride.

16. The method according to claim 10, further comprising depositing an anti-reflective coating (ARC), prior to depositing the resist, further comprising removing the ARC after removing the resist.

17. The method according to claim 10 wherein opening the nitride comprises removing 100 Angstroms or less of the nitride hard mask within the deep trench.

18. The method according to claim 10 wherein etching the semiconductor wafer comprises removing 100 to 150 Angstroms of the nitride hard mask from over the deep trenches.

19. The method according to claim 10 wherein the memory device is a DRAM, wherein the DRAM strap profile is independent of the nitride hard mask overlay.

20. The method according to claim 10 wherein the first semiconductor material is crystalline silicon and the second semiconductor material is doped polycrystalline silicon.

21. The method according to claim 10 wherein the second semiconductor material remains intact during the nitride hard mask patterning.

* * * * *